(12) United States Patent
Fujino et al.

(10) Patent No.: US 9,818,716 B2
(45) Date of Patent: Nov. 14, 2017

(54) POWER MODULE

(71) Applicant: MITSUBISHI ELECTRIC CORPORATION, Chiyoda-ku, Tokyo (JP)

(72) Inventors: Junji Fujino, Tokyo (JP); Yoshihisa Uchida, Tokyo (JP); Shohei Ogawa, Tokyo (JP); Soichi Sakamoto, Tokyo (JP); Tatsunori Yanagimoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/324,085

(22) PCT Filed: Oct. 9, 2015

(86) PCT No.: PCT/JP2015/078719
§ 371 (c)(1),
(2) Date: Jan. 5, 2017

(87) PCT Pub. No.: WO2016/063744
PCT Pub. Date: Apr. 28, 2016

(65) Prior Publication Data
US 2017/0200691 A1    Jul. 13, 2017

(30) Foreign Application Priority Data

Oct. 20, 2014   (JP) .................................. 2014-213377

(51) Int. Cl.
*H01L 23/48*    (2006.01)
*H01L 23/00*    (2006.01)

(52) U.S. Cl.
CPC .............. *H01L 24/45* (2013.01); *H01L 24/09* (2013.01); *H01L 24/33* (2013.01); *H01L 24/49* (2013.01);
(Continued)

(58) Field of Classification Search
CPC .............................. H01L 24/45; H01L 24/49
(Continued)

(56) References Cited

FOREIGN PATENT DOCUMENTS

| JP | 10-261664 A | 9/1998 |
|----|-------------|--------|
| JP | 2012-028674 A | 2/2012 |
| JP | 2013-118310 A | 6/2013 |

OTHER PUBLICATIONS

International Search Report (PCT/ISA/210) dated Dec. 22, 2015, by the Japanese Patent Office as the International Searching Authority for International Application No. PCT/JP2015/078719.
(Continued)

*Primary Examiner* — Anthony Ho
(74) *Attorney, Agent, or Firm* — Buchanan Ingersoll & Rooney PC

(57) ABSTRACT

A power module is fabricated, employing a clad metal that is formed by pressure-laminating aluminum and copper, in such a manner that the aluminum layer of the clad metal is bonded such as by ultrasonic bonding to the surface electrode of the power semiconductor chip and a wire is bonded to the copper layer thereof to establish electrical circuit. The clad metal is thermally treated in advance at a temperature higher than the operating temperature of the power semiconductor chip to sufficiently form intermetallic compounds at the interface between the aluminum layer and the copper layer for the intermetallic compounds so as not to grow in thickness after the bonding processes.

6 Claims, 11 Drawing Sheets

(52) U.S. Cl.
CPC .............. *H01L 2224/29109* (2013.01); *H01L 2224/29111* (2013.01); *H01L 2224/29123* (2013.01); *H01L 2224/29124* (2013.01); *H01L 2224/45014* (2013.01); *H01L 2224/48091* (2013.01); *H01L 2224/48647* (2013.01); *H01L 2224/49113* (2013.01); *H01L 2224/73265* (2013.01)

(58) Field of Classification Search
USPC ........................................................ 257/741
See application file for complete search history.

(56) References Cited

OTHER PUBLICATIONS

Written Opinion (PCT/ISA/237) dated Dec. 22, 2015, by the Japanese Patent Office as the International Searching Authority for International Application No. PCT/JP2015/078719.

Xie et al., "Formation of Intermatellic Phases on the Bond Interface of Aluminum-Clad Copper", J.Japan Inst. Metals, 2011, pp. 166-172, vol. 75, No. 3 (with English Abstract).

POWER MODULE

TECHNICAL FIELD

The present invention relates to power modules used in every situation from generation and transmission of electric power to efficient utilization and regeneration of energy.

BACKGROUND ART

Power modules have come into widespread use in almost products such as from industrial equipment to home appliances and information terminals; in particular, power modules used in home appliances need high productivities adaptable to various kinds of productions and high reliability as well as reduction in size and weight. At the same time, the power modules also need to be a package type applicable to silicon carbide (SiC) semiconductors that would become dominant in the future due to the fact of their high operating temperature and excellent efficiency.

PRIOR ART DOCUMENTS

Patent Documents

Patent Document 1: JP 1110-261664 A
Patent Document 2: JP 2012-028674 A

Non-Patent Document

Non-Patent Document 1: Wei Xie, et al., "Formation of Intermetallic Phase on the Bond Interface of Aluminum-Clad Copper" Journal of the Japan Institute of Metals and Materials. Vol. 75 No. 3, March, 2011, pp. 166-172

SUMMARY OF THE INVENTION

Problem that the Invention is to Solve

A power module is characterized as having a semiconductor that handles a high voltage of more than 100 V and a large current of more than 100 A. In order to pass such a large current over 100 A, a plurality of bonding wires such as aluminum wires as thick as 0.5 mm diameter are generally used to connect with the surface electrode of the power semiconductor chip to establish the electric circuit. With application of power modules to various products because of recent environmental issues such as with the global warming, resource saving, and energy, there has been increasing need for wire bonding using cooper wires, which have a higher thermal resistance and a higher current-carrying capacity compared with aluminum wires, to achieve more compactness than ever before, while being operable for such a large current over 100 A. Since copper wires, however, are hard and difficult to deform compared to aluminum wires, there are fears of damage such as due to a shear fracture of the surface electrode of a power semiconductor during wire bonding. Moreover, even though the problem with damage to the chip can be overcome, thermal stress at a bonded interface becomes large with increasing operating temperature in a case of a high operating temperature of more than 250° C. as with a SiC power semiconductor chip, thus raising a problem of ensuring reliability such as in temperature cycle resistance.

Patent Document 1 proposed a method of reducing damage to the power semiconductor chip by placing an aluminum foil on the surface of the power semiconductor chip and then performing copper wire bonding from the top. This method might overcome the damage problem; however, if aluminum itself is exposed to a high temperature of more than 175° C., grain boundaries become apparent because of grain coarsening due to recrystallization, thus leading to a fear of a fracture owing to cracks initiated from the grain boundaries.

Patent Document 2 proposed a method of ensuring reliability during operation in a high temperature by reducing thermal stress produced in the bonded portions as well as of mitigating damage such as due to strain caused by difference in thermal expansion during the wire bonding by interposing between the power semiconductor chip and the bonding wire a buffer plate A having a thermal expansion coefficient $\alpha_1$ close to that of a power semiconductor chip (SiC) and another buffer plate B having a thermal expansion coefficient $\alpha_2$ close to that of the wire. In this method, since the buffer plates are laminated by soldering, there is a fear that thermal resistance, such as temperature cycle resistance, of the soldered portion will be insufficient in the long term operation.

Means for Solving the Problem

A power module according to the present invention includes a substrate; a power semiconductor chip mounted on the substrate; an electrode formed on a surface of the power semiconductor chip; a metal laminate sheet bonded to the electrode; and a wire for bonding the metal laminate sheet to the substrate, wherein the metal laminate sheet is formed of a layer that is to be in contact with the electrode and whose major material is the same as that of electrode, and of another layer to which the wire to be bonded and whose major material is the same as that of the wire, and wherein intermetallic compounds having a thickness of 5 µm to 100 µm are formed between the two layers of the metal laminate sheet.

Advantages of the Invention

According to the present invention, a clad metal formed by pressure-laminating an aluminum foil and a copper foil serves as a buffer plate, thereby allowing for reducing damage to the power semiconductor chip during copper wire bonding. Since the aluminum layer, which has a lower recrystallization temperature and a lower thermal resistance than copper, does not exposed to a surface in contact with the encapsulating resin, an effect of embrittlement due to grain coarsening hardly appears even when the clad metal is maintained at a temperature higher than the operation temperature of a conventional silicon (Si) power semiconductor chip. Moreover, bonding of different metals is avoided by bonding the aluminum layer of the clad metal to the aluminum electrode of the power semiconductor chip and by bonding copper wires to the copper layer of the clad metal. This suppresses embrittlement due to formation of intermetallic compounds during operation of the semiconductor after assembly, thereby allowing for preventing occurrence of a crack and the like due to thermal stress. Additionally, it is separately confirmed that there is no problem caused such as by the embrittlement due to the formation of intermetallic compounds in the lamination interface of the clad metal itself (see Non-Patent Document 1).

EMBODIMENTS FOR CARRYING OUT THE INVENTION

Embodiment 1

Figure 1:
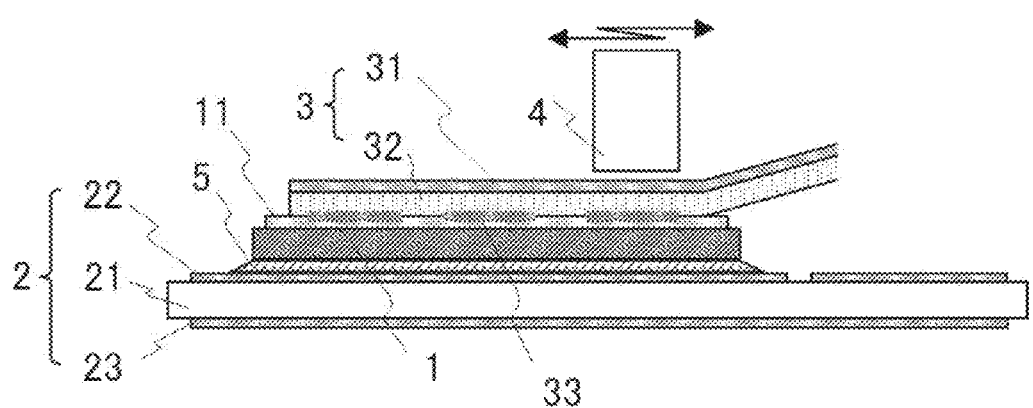
FIG. 1 is a schematic cross-sectional view of a power module according to Embodiment 1 of the present invention.

FIGS. 1 to 5 and FIG. 7 are schematic cross-sectional views of a power module according to Embodiment 1. As shown in FIG. 1, a power semiconductor chip 1 is joined by a solder 5 to an upper conductive layer 22 (a 0.4-mm thick copper), not to a lower conductive layer 23, of a ceramic substrate 2 (a 0.635-mm thick alumina substrate 21). An aluminum-copper clad ribbon 3 (10 mm wide) that is a metal laminate sheet of an aluminum layer 32 (0.2 mm thick) and a copper layer 31 (0.05 mm thick) is placed in position on an aluminum principal electrode 11 (11 mm×11 mm×0.1 mm) of the power semiconductor chip (a silicon (Si) diode (12 mm×12 mm×0.3 mm)), and then ultrasonic waves are applied from an ultrasonic bonding tool 4 having a tip (2 mm×2 mm×20 mm) to form bonded portions 33. The aluminum layer of the clad metal formed by pressure-laminating an aluminum foil and a copper foil is bonded in this way such as by ultrasonic bonding to the electrode surface of the power semiconductor chip, and then wire bonding is performed to the copper layer of the clad metal to establish electrical circuit.

Figure 2:
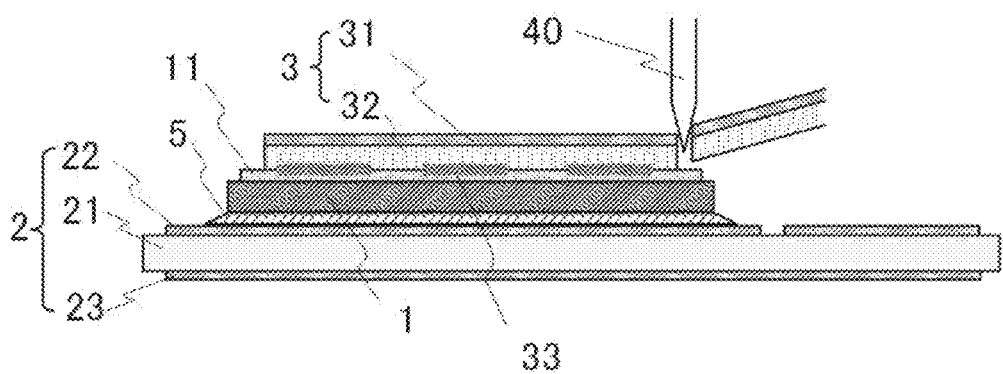
FIG. 2 is a schematic cross-sectional view of the power module showing a state of an aluminum-copper clad ribbon cut by a cutter, according to Embodiment 1 of the present invention.

Next, as shown in FIG. 2, the aluminum-copper clad ribbon 3 is severed above the power semiconductor chip in such a manner that only copper layer 31 is entirely cut with a cutter (including a mechanical one) 40 to tear off the aluminum layer 32, with the cutter being stopped at a thickness-wise middle position in the aluminum layer.

Figure 3:
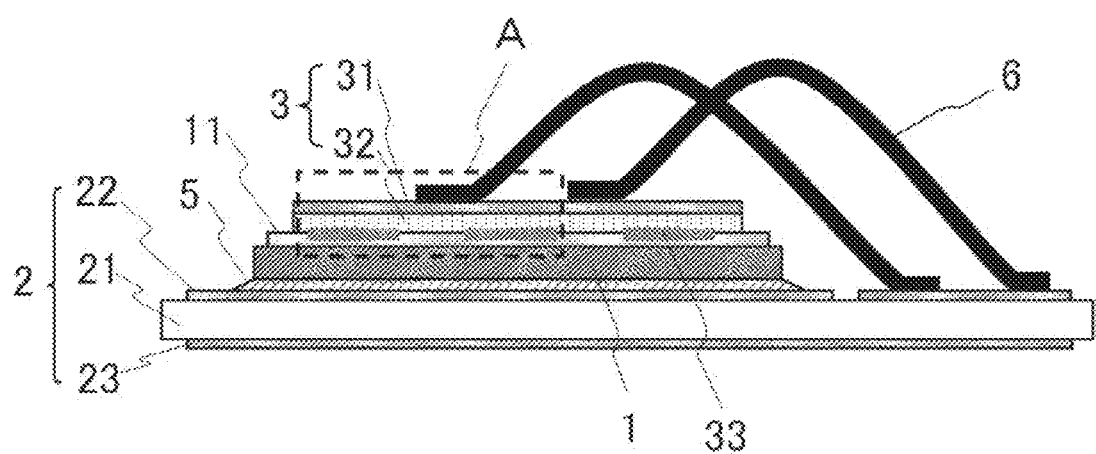
FIG. 3 is a schematic cross-sectional view of the power module showing an example of a state of electrical connection between the principal electrode of the power semiconductor chip and the conductive layer on the substrate, according to Embodiment 1 of the present invention.

Finally, an electrical connection is established between the principal electrode of the power semiconductor chip and the conductive layer on the ceramic substrate by wire bonding using a copper wire (0.4 mm diameter), as show in FIG. 3.

Figure 4:
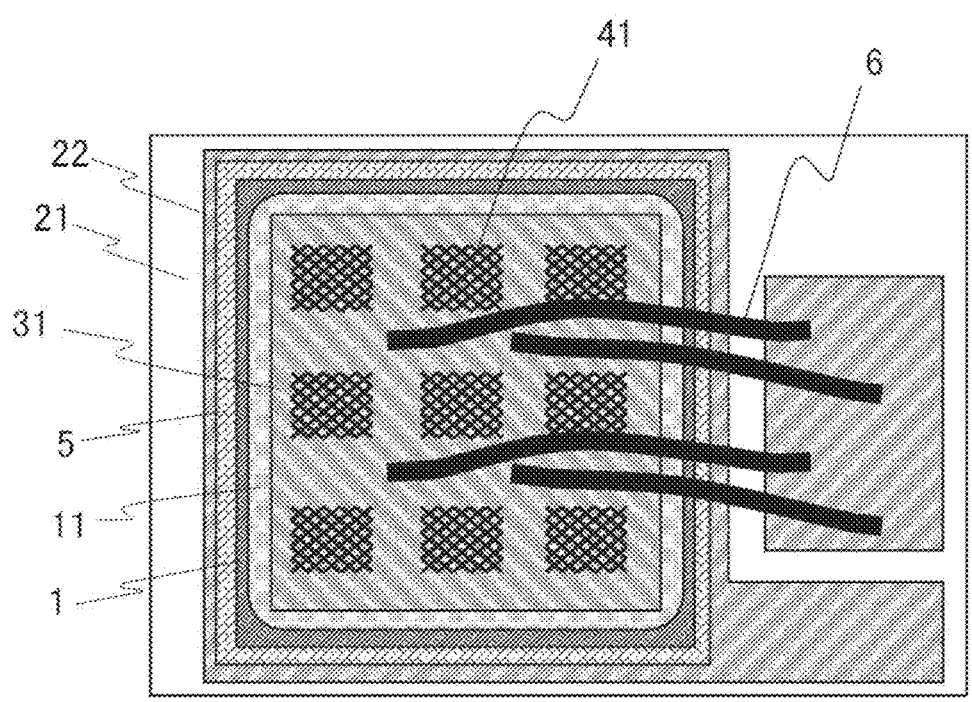
FIG. 4 is a top plan view of FIG. 3.

FIG. 4 is a top plan view of FIG. 3. The aluminum-copper clad ribbon is bonded at nine spots with the ultrasonic bonding tool, so that nine bonding marks 41 are stamped with the tool tip engraved in a cross hatched pattern for increasing friction. The copper wire bonding is performed on flat regions between the marks, thus avoiding an effect of the unevenness of the bonding marks on bonding quality.

Figure 5:
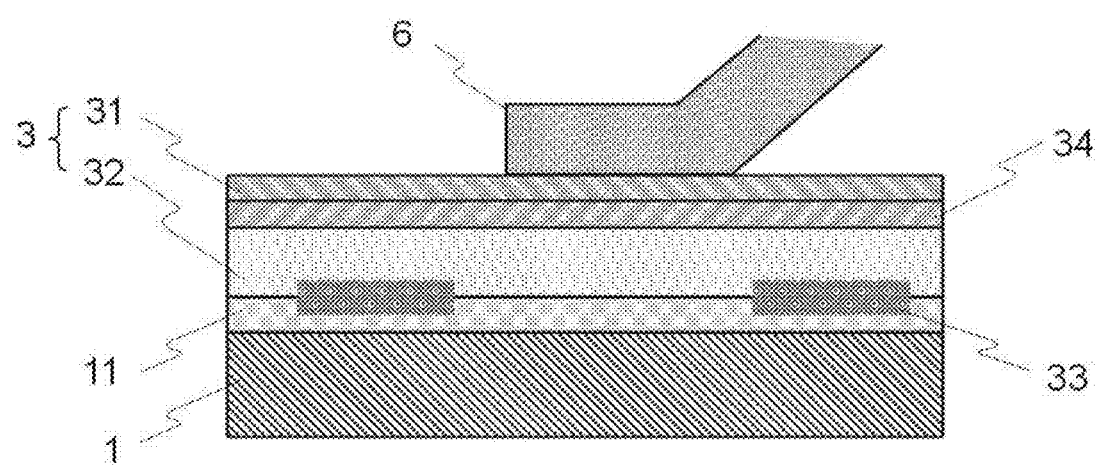
FIG. 5 is an enlarged view of the portion A of FIG. 3.

FIG. 5 is an enlarged view of the portion A of the aluminum-copper clad ribbon 3 shown in FIG. 3. The aluminum-copper clad ribbon is heated in advance at a temperature of 400° C. for three hours under an inert atmosphere to form an intermetallic Al—Cu compound layer 34 between the aluminum layer and the copper layer. Depending on an operating temperature of or a quality warranty period for a power module, according to Non-Patent Document 1 (see, for example, FIG. 10), heating at 400° C. for three hours forms such intermetallic compounds having a thickness corresponding to that of the intermetallic compounds maintained at 200° C. for 3,000 hours. Since growth of the intermetallic compounds is proportional to square root of time, even though subsequently maintained at 200° C., the growth is considerably moderate. Since the Arrhenius plot shows that the thickness growth rate of the intermetallic compounds decreases by 50% per 40 degrees C., the intermetallic compounds grow to 1/32 times thickness for the 200 degrees difference between 400° C. and 200° C. Since growth to 32 times thickness requires a time of 32-squared times, it will presumably takes a time about 1,000 times (see the explanation in the page 170 of Non-Patent Document 1).

The thermal treatment is performed in an oven or a continuous furnace, and its maximum temperature is 600° C. in consideration of the fact that the treatment should be performed at a temperature lower than the melting point of aluminum. A ten-second heating forms intermetallic compounds of 5 μm thickness between aluminum and copper. This thickness corresponds to a thermal history of 0.32 years at 200° C., and it would be sufficient for the operation lifetime of the power module, considering its operating environment conditions. Since a maximum diameter of an aluminum wire typically used for wire bonding is 0.5 mm, a thickness of 0.2 mm is necessary for the aluminum-copper clad ribbon to ensure the current-carrying capacity corresponding to that of the aluminum wire. Since the clad ribbon becomes brittle if the intermetallic compounds grows to a thickness exceeding half that of the ribbon, cracks or the like may occur during the wire bonding for establishing the electrical circuit. For that reason, the intermetallic compounds are sufficiently formed in advance at the interface between the aluminum layer and the copper layer by thermally treating the clad metal at a temperature higher than the operating temperature of the power module, for the thickness of the intermetallic compounds not to grow any more after the aluminum layer of the clad metal is bonded such as by ultrasonic bonding to the surface electrode of the power semiconductor chip.

Figure 6:
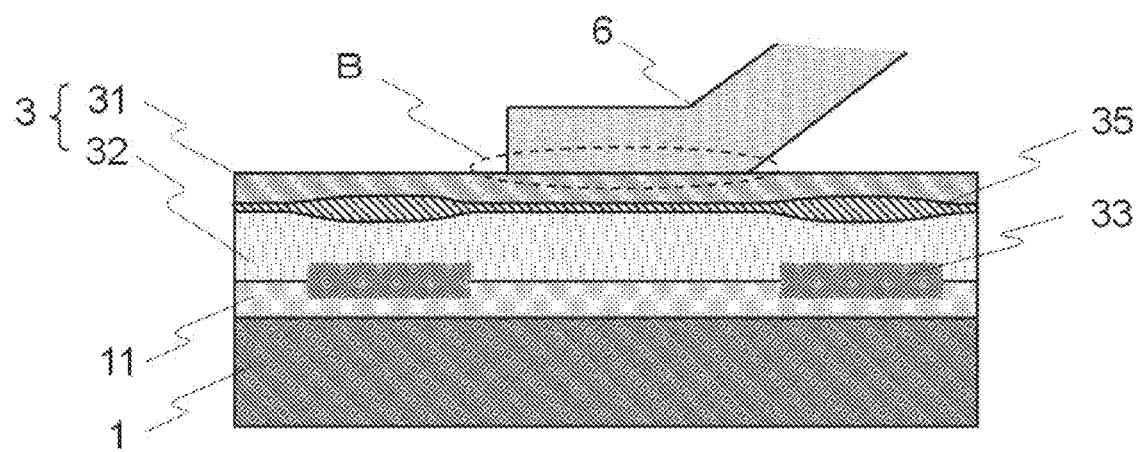
FIG. 6 is a cross-sectional view showing a model of uneven growth of intermetallic compounds.

If the intermetallic compound layer 34 is not formed initially or is formed insufficiently, a temperature variation is produced between the unbonded portions and the bonded portions 33 between the aluminum-copper clad ribbon and the principal electrode during operation of the semiconductor chip. This causes difference in growth rate of the intermetallic compounds between the copper layer and the aluminum layer, so that the intermetallic compounds 35 unevenly grow in the thickness direction as exemplarily shown in FIG. 6, which may affects the copper wire-bonded spots of the clad surface. That is, there is a fear that separation of the copper wire 6 occurs in the broken-line enclosed portion B of FIG. 6.

While the clad ribbon having a thickness of 0.25 mm, which is a combination of aluminum and copper, is used here, a combination of copper and other metal (magnesium, tin, or indium) that has a flexibility comparable to aluminum also brings about an effect of suppressing damage due to wire bonding.

A 0.05-mm or more thickness of the aluminum layer allows it to be torn off such as with half-cut by a cutter without damaging the semiconductor electrode, and a thickness up to about 1 mm allows the ultrasonic bonding and the tearing off to be favorably performed.

It is separately confirmed that a 0.05-mm or more thickness of the copper layer allows for ordinal copper wire bonding without propagating deformation to the lower aluminum layer. A 0.2-mm or less thickness of the copper layer also allows the ribbon to be ultrasonically bonded to and severed above the semiconductor chip. It is conceivable that ultrasonic bonding is easier for the copper layer thinner than the 1:1 thickness ratio between the aluminum layer and the copper layer, but the thickness ratio need not be limited to that.

While an aluminum-copper clad ribbon is used here, the same effect can also be brought about using a piece of clad metal beforehand cut into a size smaller by 1 mm than each side of the surface electrode of the semiconductor chip. While alumina is used here for the ceramic substrate, a ceramic substrate such as made of aluminum nitride or silicon nitride can also bring about the same effect. While copper is used for the conductive layers, use of a ceramic substrate having aluminum conductive layers can also bring about the same effect. Furthermore, die bonding the power semiconductor chip to or wire bonding to a lead frame can also bring about the same effect.

While a diode is used here as the power semiconductor chip, an insulated gate bipolar transistor (IGBT) may be incorporated in the same manner. While a copper electrode plate is used here, use of an aluminum plate or a copper-inver-copper (CIC) clad plate also brings about the same effect.

While here the copper layer is entirely cut by the cutter to perform the step of tearing off the aluminum layer, even though the copper layer is cut to a middle of its thickness, the ribbon can also be severed by being torn off in a later step, thus mitigating damage to the power semiconductor chip. Forming a V-notch in the ribbon facilitates the severing, so that the ribbon can be severed above the semiconductor chip without damaging the chip.

While here the bonding is performed by separately pressing, onto the multiple different spots of the clad ribbon surface, the ultrasonic bonding tool having a tip (2 mm square×20 mm long) smaller than the surface electrode (11 mm square×0.01 mm thick) of the power semiconductor chip, bonding all at once for the whole surface of the clad ribbon using an ultrasonic bonding tool that has nine of the cross hatched patterns engraved separately on its tip can also bring about the same effect. This method is advantageous for reducing the number of bonding steps.

Figure 7:
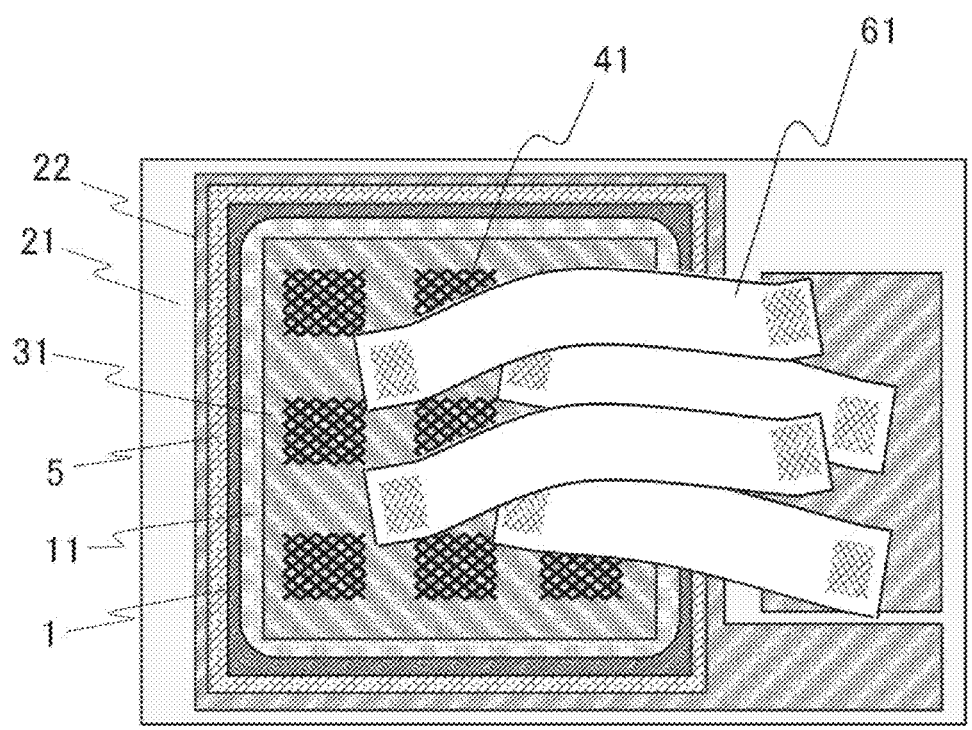
FIG. 7 is a view showing an example case of substituting ribbons for the wires shown in FIG. 4.

While here the electrical circuit is established by copper wire bonding, the same effect can also be brought about using copper ribbons 61 (2 mm width×0.2 mm thick) as shown in FIG. 7. In this case, since each copper ribbon has a cross section larger than that of the copper wire, current-carrying capacity increases and generation of Joule heat reduces, thus allowing for improvement in reliability.

While here the aluminum-copper clad ribbon is bonded to the power semiconductor chip by ultrasonic bonding, bonding such as by thermal pressure bonding, vacuum bonding, or an electrically conductive adhesive can also exhibit the same effect.

Forming in advance the intermetallic compound layer by thermal treatment at the interface between the two layers of the metal laminate sheet moderates growth of the intermetallic compounds depending on a use environment of the semiconductor device. This reduces variation in characteristics of the device, thus ensuring reliability thereof.

Thus, among the two layers of the metal laminate sheet, a first layer to be in contact with the surface of the semiconductor chip is substantially the same in composition as the surface electrode of the semiconductor chip, and a second layer to which bonding wires to be bonded is substantially the same in composition as the wires. This can suppress formation of brittle intermetallic compound layer due to metal diffusion in a temperature higher than that during the bonding steps or operation of the semiconductor chip. Furthermore, the first layer having a lower thermal resistance is not exposed to surfaces (in contact with the encapsulating resin) near the wire bonding interfaces, thus preventing generation of the initiation point of a crack caused by embrittlement due to grain coarsening.

Embodiment 2

Figure 8:
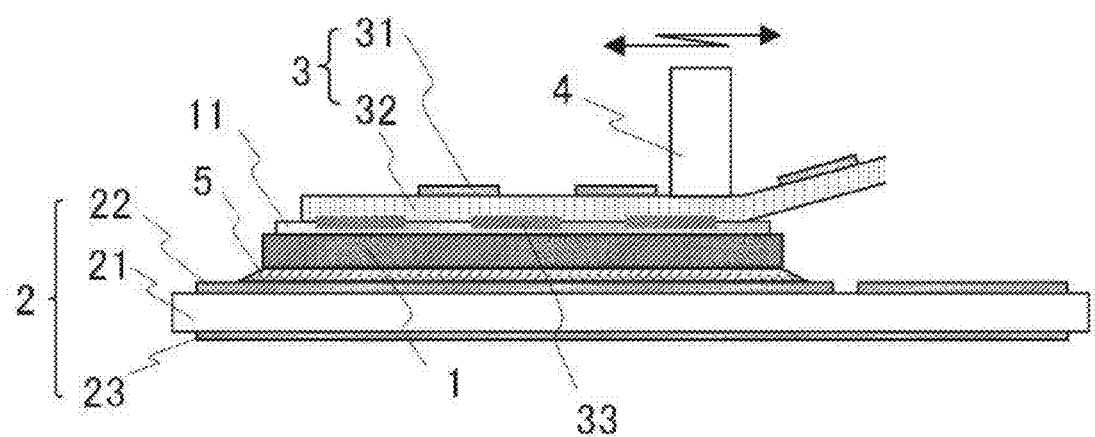
FIG. 8 is a schematic cross-sectional view of a power module according to Embodiment 2 of the present invention.

FIGS. 8 to 11 are schematic cross-sectional views of a power module according to Embodiment 2. As shown in FIG. 8, the power semiconductor chip 1 is joined by the solder 5 to the conductive layer 22 (a 0.4-mm thick copper), not to the lower conductive layer 23, of a ceramic substrate 2 (a 0.657-mm thick alumina substrate). An aluminum-copper clad ribbon 3 (10 mm wide) that is a metal laminate sheet of a stripe-pattern copper layer 31 (2 mm wide and 3 mm slit) and the aluminum layer 32 (0.2 mm thick) is placed in position on the aluminum principal electrode 11 (11 mm×11 mm×0.1 mm) of the power semiconductor chip (a Si diode (12 mm×12 mm×0.3 mm)), and then ultrasonic waves are applied from the ultrasonic bonding tool 4 having a tip (2 mm×2 mm×20 mm) to form bonded portions 33 in regions without the copper pattern.

Figure 9:
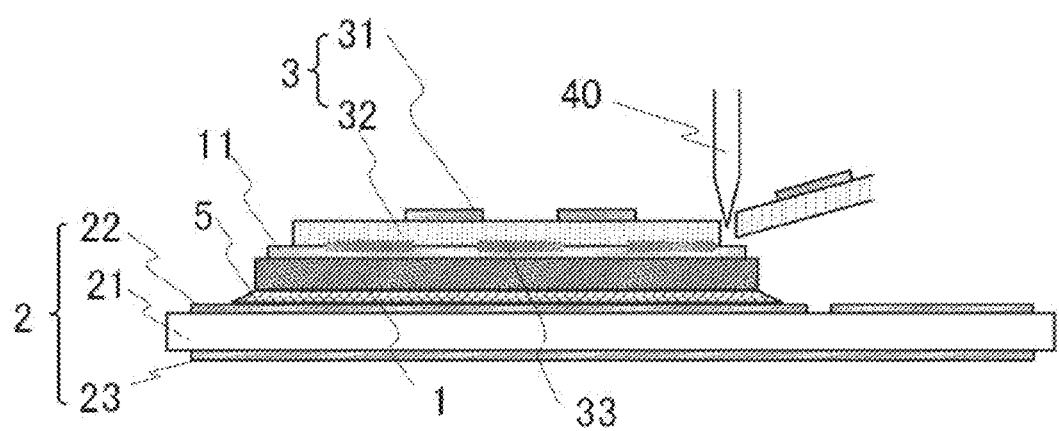
FIG. 9 is a schematic cross-sectional view of the power module showing a state of an aluminum-copper clad ribbon cut by a cutter, according to Embodiment 2 of the present invention.

Next, as shown in FIG. 9, the aluminum-copper clad ribbon 3 is severed above the power semiconductor chip in such a manner that only copper layer 31 is entirely cut with a cutter (including a mechanical one) 40 to tear off the aluminum layer 32, with the cutter being stopped at a thickness-wise middle position in the aluminum layer, as with FIG. 2.

Figure 10:
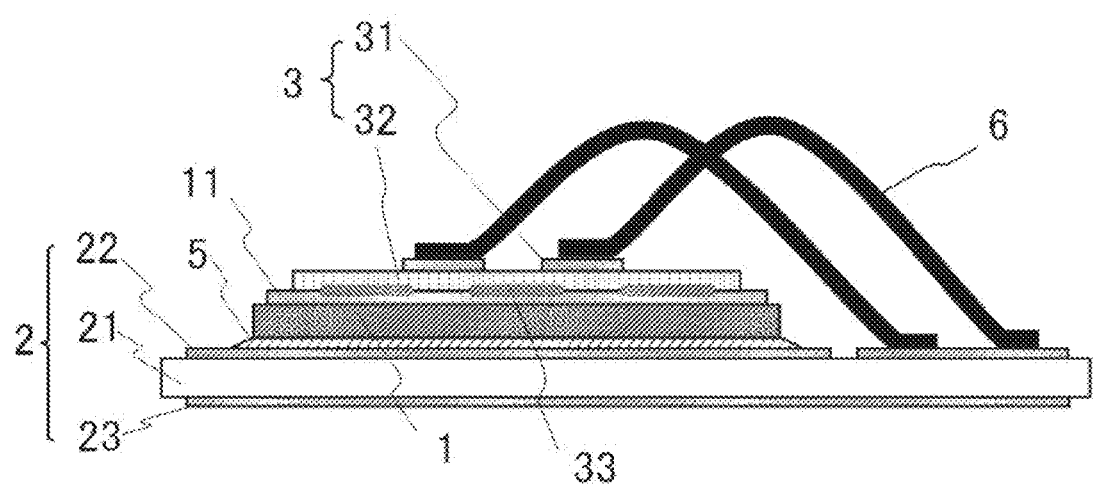
FIG. 10 is a schematic cross-sectional view of the power module showing an example of a state of electrical connection by wires between the principal electrode of the power semiconductor chip and the conductive layer on the substrate, according to Embodiment 2 of the present invention.
Figure 11:
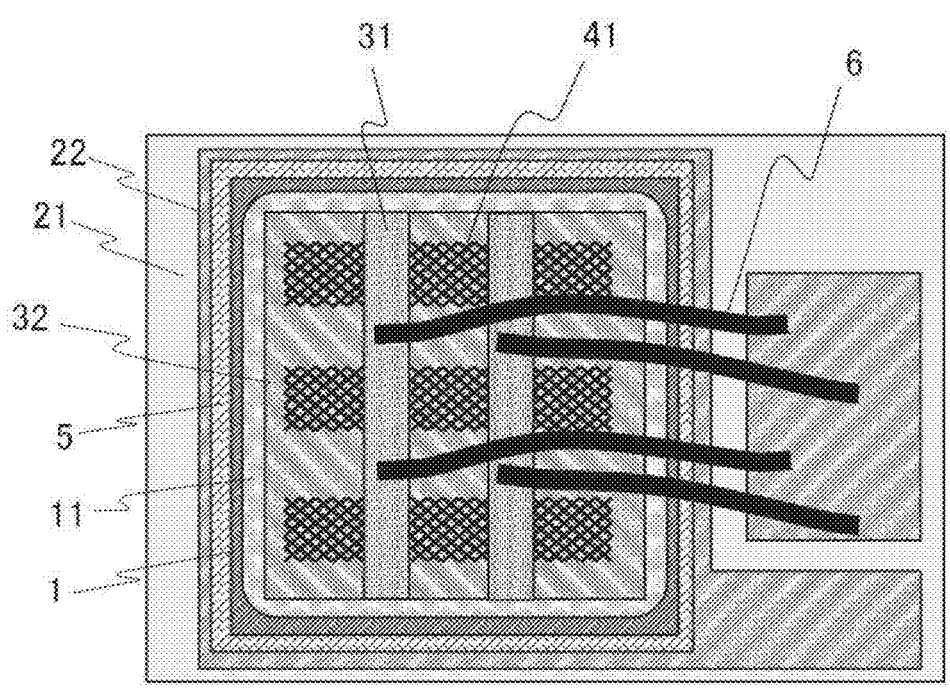
FIG. 11 is a top plan view of FIG. 10.

Finally, an electrical connection is established between the principal electrode of the power semiconductor chip and the conductive layer on the ceramic substrate by wire bonding using a copper wire (0.4 mm diameter), as show in FIG. 10. FIG. 11 is a top plan view of FIG. 10. The aluminum-copper clad ribbon is bonded at nine spots with the ultrasonic bonding tool, so that nine bonding marks 41 are stamped with the tool tip engraved in the cross hatched pattern for increasing friction. The copper wire bonding is performed on regions between the bonding marks, of the copper pattern. This mitigates ultrasonic bonding conditions, for example, relatively reduces pressure force to the wire and shortens time for the bonding, to reduce damage to the power semiconductor chip, thereby suppressing an effect of the unevenness of the bonding marks on bonding quality such as increasing or decreasing of the bonded areas.

The aluminum-copper clad ribbon is in advance heated at a temperature of 400° C. for three hours under an inert atmosphere to form an intermetallic compound layer 34 between the aluminum layer and the copper layer. Depending on an operating temperature of or a quality warranty period for a power module, the heating forms such intermetallic compounds having a thickness corresponding to that of the intermetallic compounds maintained at 200° C. for 3,000 hours. Since growth of the intermetallic compounds is proportional to square root of time (see Non-Patent Document 1), even though maintained subsequently at 200° C., the growth is considerably moderate.

While the clad ribbon having a given thickness of 0.25 mm, which is the combination of aluminum and copper, is used here, a combination of copper and other metal (magnesium, tin, or indium) that has a flexibility comparable to aluminum also brings about an effect of suppressing damage due to wire bonding.

A 0.05-mm or more thickness of the aluminum layer allows it to be torn off such as with half-cut by a cutter without damaging the semiconductor electrode, and a thickness up to about 1 mm generally allows the ultrasonic bonding and the tearing off to be favorably performed.

A 0.05-mm or more thickness of the copper layer allows for an ordinal copper wire bonding without propagating deformation to the lower aluminum layer. It is conceivable that ultrasonic bonding is easier for the ribbon having the copper layer thinner than the 1:1 thickness ratio between the aluminum layer and the copper layer because aluminum is more deformable and the aluminum layer is thicker than that of the copper layer, but the thickness ratio need not be limited to that.

While an aluminum-copper clad ribbon is used here, the same effect can also be brought about using a piece of the clad metal beforehand cut into a predetermined size smaller by 1 mm than each side of the surface electrode of the semiconductor chip. While alumina is used here for the ceramic substrate, a ceramic substrate such as made of aluminum nitride or silicon nitride can also bring about the same effect. Furthermore, while copper is used for the conductive layers, use of a ceramic substrate having aluminum conductive layers can also bring about the same effect.

While a diode is used here as the power semiconductor chip, a transistor chip including an insulated gate bipolar transistor (IGBT) can be incorporated in the same manner.

While here the copper layer is entirely cut by the cutter to perform the step of tearing off the aluminum layer, even though the copper layer is cut to the middle of its thickness, the ribbon can also be severed, thus mitigating damage to the power semiconductor chip.

While here the bonding is performed by separately pressing, onto the multiple spots of the clad ribbon, the ultrasonic bonding tool having the tip (2 mm square×20 mm long) smaller than the surface electrode (11 mm square×0.01 mm thick) of the power semiconductor chip, bonding all at once for the whole surface of the clad ribbon using an ultrasonic bonding tool having cross hatched patterns engraved separately on its tip can also bring about the same effect.

While a stripe-pattern copper layer is employer here, a polka dotted pattern or a checkered flag pattern can also bring about the same effect. While here the copper pattern is fabricated by removing the unnecessary portions from the aluminum-copper clad ribbon by etching or other removing processes, cladding by pressure rolling along with a pre-patterned copper foil can also bring about the same effect. In this case, no uneven state of the surface (the copper pattern is embedded in the aluminum layer) raises no particular problems because the unevenness causes no effect on bondability. It should be noted that each embodiment of the present invention may be freely combined, or may be appropriately modified or omitted within the spirit and the scope of the invention.

LIST OF REFERENCE NUMERALS

1; power semiconductor chip;
2; ceramic substrate;
3; aluminum-copper clad ribbon;
4; ultrasonic bonding tool;
5; solder;
6; copper wire;
11; principal electrode;
21; alumina substrate;
22, 23; conductive layer;
31; copper layer;
32; aluminum layer;
33; bonded portion;
34; intermetallic compound layer;
40; cutter;
41; bonding marks; and
61; copper ribbon.

The invention claimed is:

1. A power module comprising:
a substrate;
a power semiconductor chip mounted on the substrate;
an electrode formed on a surface of the power semiconductor chip;
a metal laminate sheet bonded to the electrode; and
a wire for bonding the metal laminate sheet to the substrate, wherein the metal laminate sheet is formed of a layer that is to be in contact with the electrode and whose major material is the same as that of electrode, and of another layer to which the wire to be bonded and whose major material is the same as that of the wire, and wherein intermetallic compounds having a thickness of 5 μm to 100 μm are formed between the two layers of the metal laminate sheet.

2. The power module of claim 1, wherein the metal laminate sheet is thermally treated in advance at a temperature higher than an operating temperature of the power module before bonded to the electrode.

3. The power module of claim 1 wherein the layer to which the wire to be bonded, of the metal laminate sheet is partially laminated on the layer thereof to be in contact with the electrode.

4. The power module of claim 1 wherein a ribbon that has a width comparable to or narrower than that of the electrode of the power semiconductor chip is employed instead of the wire.

5. The power module of claim 1 wherein the layer to be in contact with the electrode, of the metal laminate sheet is principally composed of aluminum and the layer thereof to which the wire to be bonded is principally composed of copper.

6. The power module of claim 1 wherein a material of the layer to be in contact with the electrode, of the metal laminate sheet is any one of magnesium, tin, or indium.

* * * * *